United States Patent
Krishnamoorthy

(10) Patent No.: US 11,803,774 B2
(45) Date of Patent: Oct. 31, 2023

(54) SYSTEM FOR GENERATING AN EXECUTION SEQUENCE USING LEARNING REINFORCEMENT

(71) Applicant: BANK OF AMERICA CORPORATION, Charlotte, NC (US)

(72) Inventor: Madhusudhanan Krishnamoorthy, Chennai (IN)

(73) Assignee: BANK OF AMERICA CORPORATION, Charlotte, NC (US)

( * ) Notice: Subject to any disclaimer, the term of this patent is extended or adjusted under 35 U.S.C. 154(b) by 748 days.

(21) Appl. No.: 16/925,052

(22) Filed: Jul. 9, 2020

(65) Prior Publication Data

US 2022/0012628 A1   Jan. 13, 2022

(51) Int. Cl.
*G06N 20/00* (2019.01)
*G06F 30/27* (2020.01)

(52) U.S. Cl.
CPC .............. *G06N 20/00* (2019.01); *G06F 30/27* (2020.01)

(58) Field of Classification Search
CPC ................................ G06F 30/27; G06N 20/00
See application file for complete search history.

(56) References Cited

U.S. PATENT DOCUMENTS

| | | | |
|---|---|---|---|
| 7,051,038 B1 | 5/2006 | Yeh et al. | |
| 7,117,447 B2 | 10/2006 | Cobb et al. | |
| 7,210,093 B1 | 4/2007 | Dutta | |
| 7,236,966 B1 | 6/2007 | Jackson et al. | |
| 7,272,815 B1 | 9/2007 | Eldridge | |
| 7,376,891 B2 | 5/2008 | Hitchock | |
| 7,519,553 B2* | 4/2009 | Abe | G06Q 40/00 705/30 |
| 8,285,581 B2* | 10/2012 | Abe | G06Q 30/0201 705/7.31 |
| 10,810,274 B2* | 10/2020 | Thomson | H04N 21/4826 |
| 11,481,420 B2* | 10/2022 | Smutko | G06F 11/3438 |
| 11,593,693 B2* | 2/2023 | Xiao | G06F 17/11 |
| 2005/0229157 A1 | 10/2005 | Johnson | |

(Continued)

OTHER PUBLICATIONS

Ibe, Elsevier, 2013, Chapter 13-14.*
Jeong, 2014, Elsevier, pp. 67-77.*
Mindell Random_House_2015_Chapter_1_Chapter_5.*

*Primary Examiner* — Michael I Ezewoko
(74) *Attorney, Agent, or Firm* — Moore & Van Allen PLLC; Anup Shrinivasan Iyer

(57) ABSTRACT

Systems, computer program products, and methods are described herein for generating an execution sequence using learning reinforcement. The present invention is configured to electronically receive one or more requirement modules from one or more computing devices associated with one or more resource development teams; store the one or more requirement modules in a resource development pipeline, wherein the one or more requirement modules are in a first order of execution; initiate a reinforcement learning algorithm on the one or more requirement modules; determine, using the reinforcement learning algorithm, a final order of execution for the one or more requirement modules; initiate a reordering of the one or more requirement modules from the first order of execution to a final order of execution; and initiate an execution of the one or more requirement modules in the final order of execution.

14 Claims, 2 Drawing Sheets

(56) References Cited

U.S. PATENT DOCUMENTS

| | | |
|---|---|---|
| 2006/0036973 A1 | 2/2006 | Ogami et al. |
| 2006/0069604 A1 | 3/2006 | Leukart |
| 2006/0123389 A1 | 6/2006 | Kolawa et al. |
| 2006/0212327 A1 | 9/2006 | Norman |
| 2006/0235771 A1 | 10/2006 | Oberoi |
| 2006/0236261 A1 | 10/2006 | Forstall et al. |
| 2007/0094609 A1 | 4/2007 | Gilboa et al. |
| 2007/0124682 A1 | 5/2007 | Fukeda et al. |
| 2007/0168918 A1 | 7/2007 | Metherall et al. |
| 2007/0288292 A1 | 12/2007 | Gauger |
| 2008/0077416 A1 | 3/2008 | Hetrick |
| 2008/0077530 A1 | 3/2008 | Banas et al. |
| 2008/0097734 A1 | 4/2008 | Raffo |

* cited by examiner

SYSTEM FOR GENERATING AN EXECUTION SEQUENCE USING LEARNING REINFORCEMENT

FIELD OF THE INVENTION

The present invention embraces a system for generating an execution sequence using learning reinforcement.

BACKGROUND

Entities have adopted the Agile software development methodology, which offers an iterative approach to the design and development of software to meet the fast-paced change of customer needs. Agile approaches develop requirements, stories, and solutions through the collaborative effort of self-organizing and cross-functional resource development teams and their end-users. Typically, Agile development method breaks the product development work into small increments that minimize the amount of up-front planning and design. At each sprint (or iteration)—short time frames—cross-functional resource development teams, at each phase of planning, analysis, design, coding, unit testing, and acceptance testing, develop various requirement modules that are then executed to form a working product. At each sprint, the resource development teams produce requirement modules, which are stored in a resource development pipeline in a specific order of execution.

There is a need for a system for generating an execution sequence for the requirement modules using reinforcement learning.

SUMMARY

The following presents a simplified summary of one or more embodiments of the present invention, in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments of the present invention in a simplified form as a prelude to the more detailed description that is presented later.

In one aspect, a system for generating an execution sequence using reinforcement learning is presented. The system comprising: at least one non-transitory storage device; and at least one processing device coupled to the at least one non-transitory storage device, wherein the at least one processing device is configured to: electronically receive one or more requirement modules from one or more computing devices associated with one or more resource development teams; store the one or more requirement modules in a resource development pipeline, wherein the one or more requirement modules are in a first order of execution; initiate a reinforcement learning algorithm on the one or more requirement modules; determine, using the reinforcement learning algorithm, a final order of execution for the one or more requirement modules; initiate a reordering of the one or more requirement modules from the first order of execution to a final order of execution; and initiate an execution of the one or more requirement modules in the final order of execution.

In some embodiments, the at least one processing device is further configured to: implement a first distributed impact simulation model using the one or more requirement modules in the first order of execution; initiate the reinforcement learning algorithm on the first distributed impact simulation model; and determine, using the reinforcement learning algorithm, a performance assessment output associated with an execution of each of the one or more requirement modules in the first order of execution.

In some embodiments, the at least one processing device is further configured to implement the first distributed impact simulation model, wherein implementing further comprises: electronically retrieving the one or more requirement modules stored in the resource development pipeline; and initiating an execution of the one or more requirement modules in the first order of execution.

In some embodiments, the at least one processing device is further configured to: initiate an optimization policy engine on the performance assessment output associated with the one or more requirement modules in the first order of execution; and encode, using the optimization policy engine, the performance assessment output into rewards and costs, wherein encoding further comprises assigning a cost to a first set of the one or more requirement modules in the first order of execution and assigning a reward to a second set of the one or more requirement modules in the first order of execution.

In some embodiments, the at least one processing device is further configured to: generate an optimization policy based on at least the rewards and costs, wherein generating further comprises generating a second order of execution based on at least maximizing an aggregated reward calculated from the second set of the first order of execution.

In some embodiments, the at least one processing device is further configured to: generate a second distributed impact simulation model based on at least the second order of execution determined using the optimization policy; and implement the second distributed impact simulation model using the one or more requirement modules in the second order of execution.

In some embodiments, the at least one processing device is further configured to: iteratively initiate the optimization policy engine to generate one or more optimization policies and one or more distributed impact simulation models based on one or more execution orders by maximizing aggregated rewards calculated from each of the one or more execution orders; and generate the final order of execution based on iteratively initiating the optimization policy engine to generate one or more optimization policies and one or more distributed impact simulation models based on one or more execution orders by maximizing aggregated rewards calculated from each of the one or more execution orders.

In some embodiments, the at least one processing device is further configured to: electronically receive, from a computing device associated with a user, the first order of execution for the one or more requirement modules.

In another aspect, a computer program product for generating an execution sequence using learning reinforcement is presented. The computer program product comprising a non-transitory computer-readable medium comprising code causing a first apparatus to: electronically receive one or more requirement modules from one or more computing devices associated with one or more resource development teams; store the one or more requirement modules in a resource development pipeline, wherein the one or more requirement modules are in a first order of execution; initiate a reinforcement learning algorithm on the one or more requirement modules; determine, using the reinforcement learning algorithm, a final order of execution for the one or more requirement modules; initiate a reordering of the one or more requirement modules from the first order of execution to a final order of execution; and initiate an execution of the one or more requirement modules in the final order of execution.

In yet another aspect, a method for generating an execution sequence using learning reinforcement is presented. The method comprising: electronically receiving one or more requirement modules from one or more computing devices associated with one or more resource development teams; storing the one or more requirement modules in a resource development pipeline, wherein the one or more requirement modules are in a first order of execution; initiating a reinforcement learning algorithm on the one or more requirement modules; determining, using the reinforcement learning algorithm, a final order of execution for the one or more requirement modules; initiating a reordering of the one or more requirement modules from the first order of execution to a final order of execution; and initiating an execution of the one or more requirement modules in the final order of execution.

The features, functions, and advantages that have been discussed may be achieved independently in various embodiments of the present invention or may be combined with yet other embodiments, further details of which can be seen with reference to the following description and drawings.

BRIEF DESCRIPTION OF THE DRAWINGS

Figure 1:
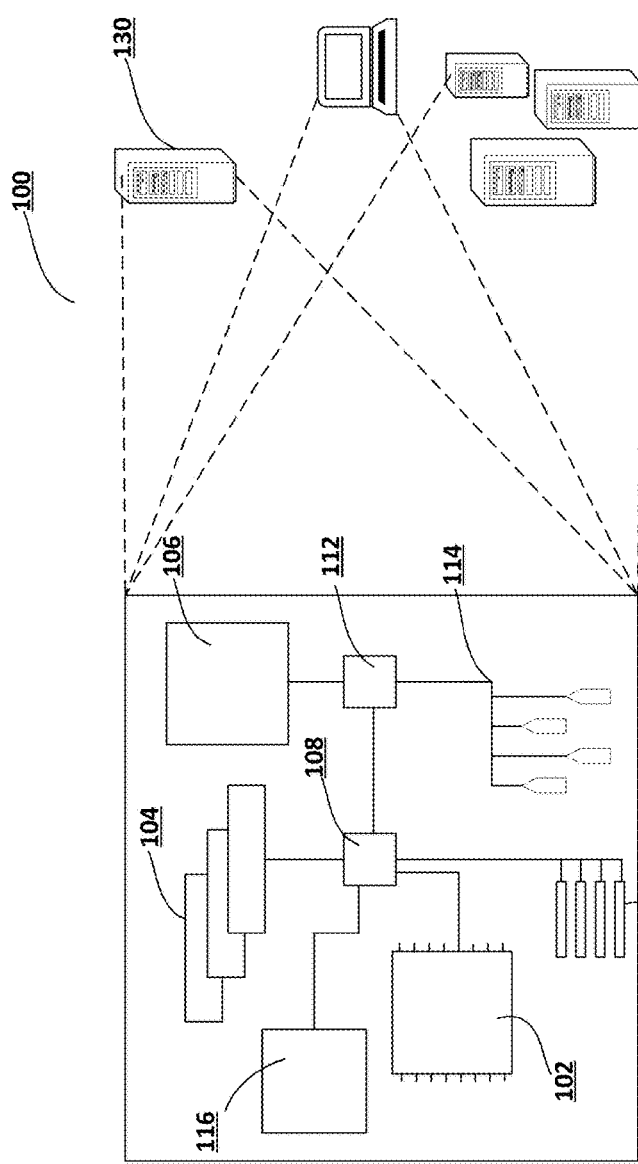
Figure 1:
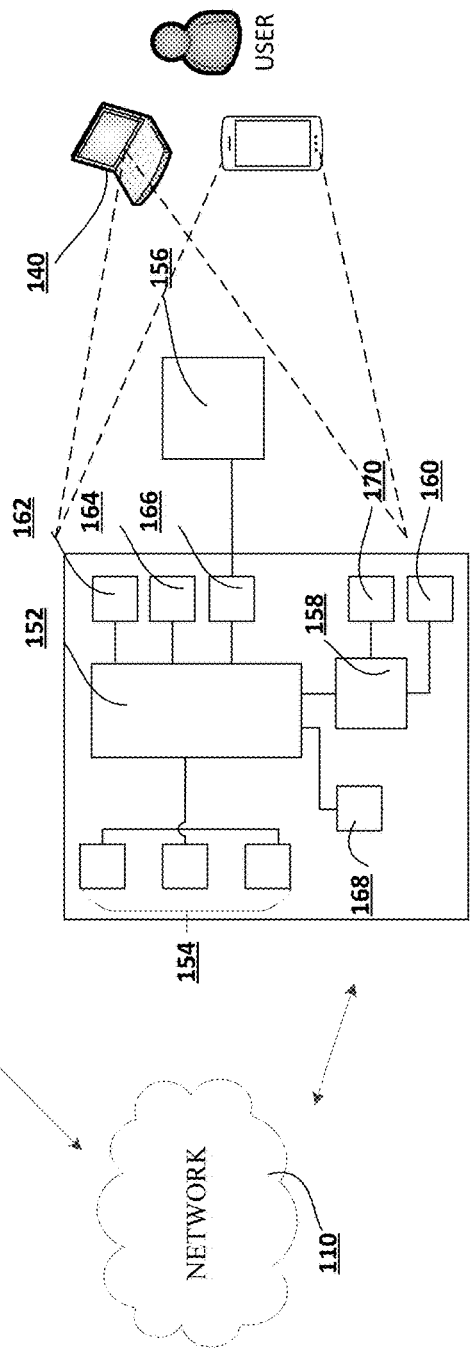
Figure 2:
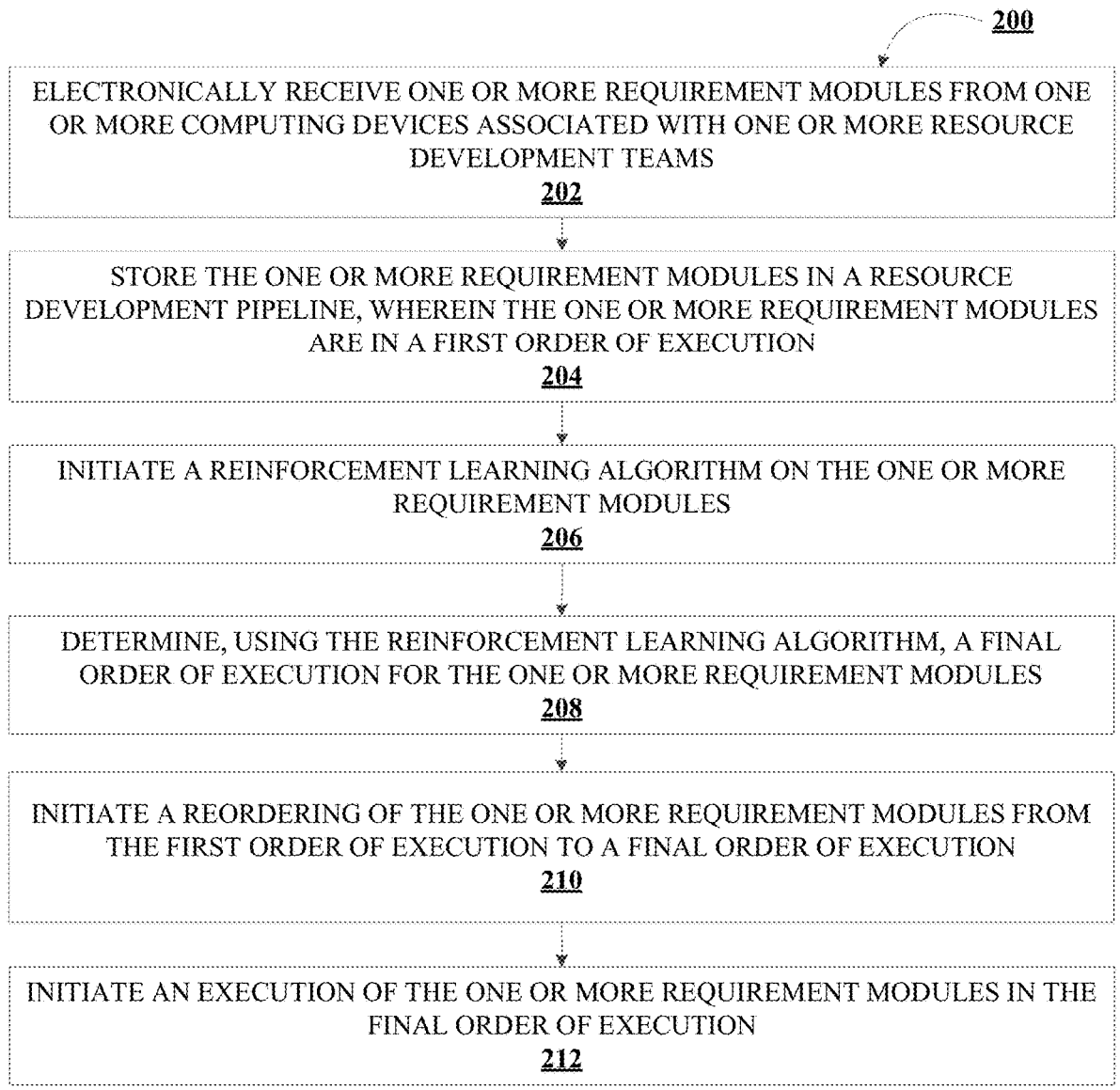

Having thus described embodiments of the invention in general terms, reference will now be made the accompanying drawings, wherein:

FIG. 1 illustrates technical components of a system for generating an execution sequence using learning reinforcement, in accordance with an embodiment of the invention; and FIG. 2 illustrates a process flow for generating an execution sequence using learning reinforcement, in accordance with an embodiment of the invention.

DETAILED DESCRIPTION OF EMBODIMENTS OF THE INVENTION

Embodiments of the present invention will now be described more fully hereinafter with reference to the accompanying drawings, in which some, but not all, embodiments of the invention are shown. Indeed, the invention may be embodied in many different forms and should not be construed as limited to the embodiments set forth herein; rather, these embodiments are provided so that this disclosure will satisfy applicable legal requirements. Where possible, any terms expressed in the singular form herein are meant to also include the plural form and vice versa, unless explicitly stated otherwise. Also, as used herein, the term "a" and/or "an" shall mean "one or more," even though the phrase "one or more" is also used herein. Furthermore, when it is said herein that something is "based on" something else, it may be based on one or more other things as well. In other words, unless expressly indicated otherwise, as used herein "based on" means "based at least in part on" or "based at least partially on." Like numbers refer to like elements throughout.

As used herein, an "entity" may be any institution employing information technology resources and particularly technology infrastructure configured for processing large amounts of data. Typically, these data can be related to the people who work for the organization, its products or services, the customers or any other aspect of the operations of the organization. As such, the entity may be any institution, group, association, financial institution, establishment, company, union, authority or the like, employing information technology resources for processing large amounts of data.

As described herein, a "user" may be an individual associated with an entity. As such, in some embodiments, the user may be an individual having past relationships, current relationships or potential future relationships with an entity. In some embodiments, a "user" may be an employee (e.g., an associate, a project manager, an IT specialist, a manager, an administrator, an internal operations analyst, or the like) of the entity or enterprises affiliated with the entity, capable of operating the systems described herein. In some embodiments, a "user" may be any individual, entity or system who has a relationship with the entity, such as a customer or a prospective customer. In other embodiments, a user may be a system performing one or more tasks described herein.

As used herein, a "user interface" may be any device or software that allows a user to input information, such as commands or data, into a device, or that allows the device to output information to the user. For example, the user interface includes a graphical user interface (GUI) or an interface to input computer-executable instructions that direct a processing device to carry out specific functions. The user interface typically employs certain input and output devices to input data received from a user second user or output data to a user. These input and output devices may include a display, mouse, keyboard, button, touchpad, touch screen, microphone, speaker, LED, light, joystick, switch, buzzer, bell, and/or other user input/output device for communicating with one or more users.

As used herein, an "engine" may refer to core elements of a computer program, or part of a computer program that serves as a foundation for a larger piece of software and drives the functionality of the software. An engine may be self-contained, but externally-controllable code that encapsulates powerful logic designed to perform or execute a specific type of function. In one aspect, an engine may be underlying source code that establishes file hierarchy, input and output methods, and how a specific part of a computer program interacts or communicates with other software and/or hardware. The specific components of an engine may vary based on the needs of the specific computer program as part of the larger piece of software. In some embodiments, an engine may be configured to retrieve resources created in other computer programs, which may then be ported into the engine for use during specific operational aspects of the engine. An engine may be configurable to be implemented within any general purpose computing system. In doing so, the engine may be configured to execute source code embedded therein to control specific features of the general purpose computing system to execute specific computing operations, thereby transforming the general purpose system into a specific purpose computing system.

As used herein, "authentication credentials" may be any information that can be used to identify of a user. For example, a system may prompt a user to enter authentication information such as a username, a password, a personal identification number (PIN), a passcode, biometric information (e.g., voice authentication, a fingerprint, and/or a retina scan), an answer to a security question, a unique intrinsic user activity, such as making a predefined motion with a user device. This authentication information may be used to authenticate the identity of the user (e.g., determine that the authentication information is associated with the account) and determine that the user has authority to access an account or system. In some embodiments, the system may be owned or operated by an entity. In such embodiments, the entity may employ additional computer systems, such as authentication servers, to validate and certify resources inputted by the plurality of users within the system. The system may further use its authentication servers to certify the identity of users of the system, such that other users may verify the identity of the certified users. In some embodiments, the entity may certify the identity of the users. Furthermore, authentication information or permission may be assigned to or required from a user, application, computing node, computing cluster, or the like to access stored data within at least a portion of the system.

As used herein, an "interaction" may refer to any communication between one or more users, one or more entities or institutions, and/or one or more devices, nodes, clusters, or systems within the system environment described herein. For example, an interaction may refer to a transfer of data between devices, an accessing of stored data by one or more nodes of a computing cluster, a transmission of a requested task, or the like.

FIG. 1 presents an exemplary block diagram of the system environment for generating an execution sequence using learning reinforcement 100, in accordance with an embodiment of the invention. FIG. 1 provides a unique system that includes specialized servers and system communicably linked across a distributive network of nodes required to perform the functions of the process flows described herein in accordance with embodiments of the present invention.

As illustrated, the system environment 100 includes a network 110, a system 130, and a user input system 140. Also shown in FIG. 1 is a user of the user input system 140. The user input system 140 may be a mobile device or other non-mobile computing device. The user may be a person who uses the user input system 140 to execute resource transfers using one or more applications stored thereon. The one or more applications may be configured to communicate with the system 130, execute a transaction, input information onto a user interface presented on the user input system 140, or the like. The applications stored on the user input system 140 and the system 130 may incorporate one or more parts of any process flow described herein.

As shown in FIG. 1, the system 130, and the user input system 140 are each operatively and selectively connected to the network 110, which may include one or more separate networks. In addition, the network 110 may include a telecommunication network, local area network (LAN), a wide area network (WAN), and/or a global area network (GAN), such as the Internet. It will also be understood that the network 110 may be secure and/or unsecure and may also include wireless and/or wired and/or optical interconnection technology.

In some embodiments, the system 130 and the user input system 140 may be used to implement the processes described herein, including the mobile-side and server-side processes for installing a computer program from a mobile device to a computer, in accordance with an embodiment of the present invention. The system 130 is intended to represent various forms of digital computers, such as laptops, desktops, workstations, personal digital assistants, servers, blade servers, mainframes, and other appropriate computers. The user input system 140 is intended to represent various forms of mobile devices, such as personal digital assistants, cellular telephones, smartphones, and other similar computing devices. The components shown here, their connections and relationships, and their functions, are meant to be exemplary only, and are not meant to limit implementations of the inventions described and/or claimed in this document.

In accordance with some embodiments, the system 130 may include a processor 102, memory 104, a storage device 106, a high-speed interface 108 connecting to memory 104, and a low-speed interface 112 connecting to low speed bus 114 and storage device 106. Each of the components 102, 104, 106, 108, 111, and 112 are interconnected using various buses, and may be mounted on a common motherboard or in other manners as appropriate. The processor 102 can process instructions for execution within the system 130, including instructions stored in the memory 104 or on the storage device 106 to display graphical information for a GUI on an external input/output device, such as display 116 coupled to a high-speed interface 108. In other implementations, multiple processors and/or multiple buses may be used, as appropriate, along with multiple memories and types of memory. Also, multiple systems, same or similar to system 130 may be connected, with each system providing portions of the necessary operations (e.g., as a server bank, a group of blade servers, or a multi-processor system). In some embodiments, the system 130 may be a server managed by the business. The system 130 may be located at the facility associated with the business or remotely from the facility associated with the business.

The memory 104 stores information within the system 130. In one implementation, the memory 104 is a volatile memory unit or units, such as volatile random access memory (RAM) having a cache area for the temporary storage of information. In another implementation, the memory 104 is a non-volatile memory unit or units. The memory 104 may also be another form of computer-readable medium, such as a magnetic or optical disk, which may be embedded and/or may be removable. The non-volatile memory may additionally or alternatively include an EEPROM, flash memory, and/or the like. The memory 104 may store any one or more of pieces of information and data used by the system in which it resides to implement the functions of that system. In this regard, the system may dynamically utilize the volatile memory over the non-volatile memory by storing multiple pieces of information in the volatile memory, thereby reducing the load on the system and increasing the processing speed.

The storage device 106 is capable of providing mass storage for the system 130. In one aspect, the storage device 106 may be or contain a computer-readable medium, such as a floppy disk device, a hard disk device, an optical disk device, or a tape device, a flash memory or other similar solid state memory device, or an array of devices, including devices in a storage area network or other configurations. A computer program product can be tangibly embodied in an information carrier. The computer program product may also contain instructions that, when executed, perform one or more methods, such as those described above. The information carrier may be a non-transitory computer- or machine-readable storage medium, such as the memory 104, the storage device 104, or memory on processor 102.

In some embodiments, the system 130 may be configured to access, via the 110, a number of other computing devices (not shown). In this regard, the system 130 may be configured to access one or more storage devices and/or one or more memory devices associated with each of the other computing devices. In this way, the system 130 may implement dynamic allocation and de-allocation of local memory resources among multiple computing devices in a parallel or distributed system. Given a group of computing devices and a collection of interconnected local memory devices, the fragmentation of memory resources is rendered irrelevant by configuring the system 130 to dynamically allocate memory based on availability of memory either locally, or in any of the other computing devices accessible via the network. In effect, it appears as though the memory is being allocated from a central pool of memory, even though the space is distributed throughout the system. This method of dynamically allocating memory provides increased flexibility when the data size changes during the lifetime of an application, and allows memory reuse for better utilization of the memory resources when the data sizes are large.

The high-speed interface 108 manages bandwidth-intensive operations for the system 130, while the low speed controller 112 manages lower bandwidth-intensive operations. Such allocation of functions is exemplary only. In some embodiments, the high-speed interface 108 is coupled to memory 104, display 116 (e.g., through a graphics processor or accelerator), and to high-speed expansion ports 111, which may accept various expansion cards (not shown). In such an implementation, low-speed controller 112 is coupled to storage device 106 and low-speed expansion port 114. The low-speed expansion port 114, which may include various communication ports (e.g., USB, Bluetooth, Ethernet, wireless Ethernet), may be coupled to one or more input/output devices, such as a keyboard, a pointing device, a scanner, or a networking device such as a switch or router, e.g., through a network adapter.

The system 130 may be implemented in a number of different forms, as shown in FIG. 1. For example, it may be implemented as a standard server, or multiple times in a group of such servers. Additionally, the system 130 may also be implemented as part of a rack server system or a personal computer such as a laptop computer. Alternatively, components from system 130 may be combined with one or more other same or similar systems and an entire system 140 may be made up of multiple computing devices communicating with each other.

FIG. 1 also illustrates a user input system 140, in accordance with an embodiment of the invention. The user input system 140 includes a processor 152, memory 154, an input/output device such as a display 156, a communication interface 158, and a transceiver 160, among other components. The user input system 140 may also be provided with a storage device, such as a microdrive or other device, to provide additional storage. Each of the components 152, 154, 158, and 160, are interconnected using various buses, and several of the components may be mounted on a common motherboard or in other manners as appropriate.

The processor 152 is configured to execute instructions within the user input system 140, including instructions stored in the memory 154. The processor may be implemented as a chipset of chips that include separate and multiple analog and digital processors. The processor may be configured to provide, for example, for coordination of the other components of the user input system 140, such as control of user interfaces, applications run by user input system 140, and wireless communication by user input system 140.

The processor 152 may be configured to communicate with the user through control interface 164 and display interface 166 coupled to a display 156. The display 156 may be, for example, a TFT LCD (Thin-Film-Transistor Liquid Crystal Display) or an OLED (Organic Light Emitting Diode) display, or other appropriate display technology. The display interface 156 may comprise appropriate circuitry and configured for driving the display 156 to present graphical and other information to a user. The control interface 164 may receive commands from a user and convert them for submission to the processor 152. In addition, an external interface 168 may be provided in communication with processor 152, so as to enable near area communication of user input system 140 with other devices. External interface 168 may provide, for example, for wired communication in some implementations, or for wireless communication in other implementations, and multiple interfaces may also be used.

The memory 154 stores information within the user input system 140. The memory 154 can be implemented as one or more of a computer-readable medium or media, a volatile memory unit or units, or a non-volatile memory unit or units. Expansion memory may also be provided and connected to user input system 140 through an expansion interface (not shown), which may include, for example, a SIMM (Single In Line Memory Module) card interface. Such expansion memory may provide extra storage space for user input system 140, or may also store applications or other information therein. In some embodiments, expansion memory may include instructions to carry out or supplement the processes described above, and may include secure information also. For example, expansion memory may be provided as a security module for user input system 140, and may be programmed with instructions that permit secure use of user input system 140. In addition, secure applications may be provided via the SIMM cards, along with additional information, such as placing identifying information on the SIMM card in a non-hackable manner. In some embodiments, the user may use the applications to execute processes described with respect to the process flows described herein. Specifically, the application executes the process flows described herein. It will be understood that the one or more applications stored in the system 130 and/or the user computing system 140 may interact with one another and may be configured to implement any one or more portions of the various user interfaces and/or process flow described herein.

The memory 154 may include, for example, flash memory and/or NVRAM memory. In one aspect, a computer program product is tangibly embodied in an information carrier. The computer program product contains instructions that, when executed, perform one or more methods, such as those described herein. The information carrier is a computer- or machine-readable medium, such as the memory 154, expansion memory, memory on processor 152, or a propagated signal that may be received, for example, over transceiver 160 or external interface 168.

In some embodiments, the user may use the user input system 140 to transmit and/or receive information or commands to and from the system 130. In this regard, the system 130 may be configured to establish a communication link with the user input system 140, whereby the communication link establishes a data channel (wired or wireless) to facilitate the transfer of data between the user input system 140 and the system 130. In doing so, the system 130 may be configured to access one or more aspects of the user input system 140, such as, a GPS device, an image capturing component (e.g., camera), a microphone, a speaker, or the like.

The user input system 140 may communicate with the system 130 (and one or more other devices) wirelessly through communication interface 158, which may include digital signal processing circuitry where necessary. Communication interface 158 may provide for communications under various modes or protocols, such as GSM voice calls, SMS, EMS, or MMS messaging, CDMA, TDMA, PDC, WCDMA, CDMA2000, or GPRS, among others. Such communication may occur, for example, through radio-frequency transceiver 160. In addition, short-range communication may occur, such as using a Bluetooth, Wi-Fi, or other such transceiver (not shown). In addition, GPS (Global Positioning System) receiver module 170 may provide additional navigation—and location-related wireless data to user input system 140, which may be used as appropriate by applications running thereon, and in some embodiments, one or more applications operating on the system 130.

The user input system 140 may also communicate audibly using audio codec 162, which may receive spoken information from a user and convert it to usable digital information. Audio codec 162 may likewise generate audible sound for a user, such as through a speaker, e.g., in a handset of user input system 140. Such sound may include sound from voice telephone calls, may include recorded sound (e.g., voice messages, music files, etc.) and may also include sound generated by one or more applications operating on the user input system 140, and in some embodiments, one or more applications operating on the system 130.

Various implementations of the systems and techniques described here can be realized in digital electronic circuitry, integrated circuitry, specially designed ASICs (application specific integrated circuits), computer hardware, firmware, software, and/or combinations thereof. These various implementations can include implementation in one or more computer programs that are executable and/or interpretable on a programmable system including at least one programmable processor, which may be special or general purpose, coupled to receive data and instructions from, and to transmit data and instructions to, a storage system, at least one input device, and at least one output device.

These computer programs (also known as programs, software, software applications or code) include machine instructions for a programmable processor, and can be implemented in a high-level procedural and/or object-oriented programming language, and/or in assembly/machine language. As used herein, the terms "machine-readable medium" "computer-readable medium" refers to any computer program product, apparatus and/or device (e.g., magnetic discs, optical disks, memory, Programmable Logic Devices (PLDs)) used to provide machine instructions and/or data to a programmable processor, including a machine-readable medium that receives machine instructions as a machine-readable signal. The term "machine-readable signal" refers to any signal used to provide machine instructions and/or data to a programmable processor.

To provide for interaction with a user, the systems and techniques described here can be implemented on a computer having a display device (e.g., a CRT (cathode ray tube) or LCD (liquid crystal display) monitor) for displaying information to the user and a keyboard and a pointing device (e.g., a mouse or a trackball) by which the user can provide input to the computer. Other kinds of devices can be used to provide for interaction with a user as well; for example, feedback provided to the user can be any form of sensory feedback (e.g., visual feedback, auditory feedback, or tactile feedback); and input from the user can be received in any form, including acoustic, speech, or tactile input.

The systems and techniques described here can be implemented in a computing system that includes a back end component (e.g., as a data server), or that includes a middleware component (e.g., an application server), or that includes a front end component (e.g., a client computer having a graphical user interface or a Web browser through which a user can interact with an implementation of the systems and techniques described here), or any combination of such back end, middleware, or front end components. The components of the system can be interconnected by any form or medium of digital data communication (e.g., a communication network). Examples of communication networks include a local area network ("LAN"), a wide area network ("WAN"), and the Internet.

The computing system can include clients and servers. A client and server are generally remote from each other and typically interact through a communication network. The relationship of client and server arises by virtue of computer programs running on the respective computers and having a client-server relationship to each other.

It will be understood that the embodiment of the system environment illustrated in FIG. 1 is exemplary and that other embodiments may vary. As another example, in some embodiments, the system 130 includes more, less, or different components. As another example, in some embodiments, some or all of the portions of the system environment 100 may be combined into a single portion. Likewise, in some embodiments, some or all of the portions of the system 130 may be separated into two or more distinct portions.

Entities have adopted the Agile software development methodology, which offers an iterative approach to the design and development of software to meet the fast-paced change of customer needs. Agile approaches develop requirements, stories, and solutions through the collaborative effort of self-organizing and cross-functional resource development teams and their end-users. Typically, Agile development method breaks the product development work into small increments that minimize the amount of up-front planning and design. At each sprint (or iteration)—short time frames—cross-functional resource development teams, at each phase of planning, analysis, design, coding, unit testing, and acceptance testing, develop various requirement modules that are then executed to form a working product. At each sprint, the resource development teams produce requirement modules, which are stored in a resource development pipeline in a specific order of execution. However, in a number of cases, the requirement modules may have unforeseeable issues with respect to the execution within the resource development pipeline. For example, requirement module 1 (first in line for execution) may have a dependency that relates to requirement module 5 (fifth in line for execution). Such a dependency may require the execution of the requirement module 5 prior to the execution of the requirement module 1. In another example, the priorities or business values associated with each requirement module may change at each sprint (iteration). In yet another example, there may be factors of uncertainty in resources and development time for the resource development teams. In each of these examples, identifying the right sequence in which the requirement modules are executed can be tedious and time consuming.

The present invention provides the functional benefit of using reinforcement learning to determine the sequence of execution for the requirement modules at each sprint. Using reinforcement learning, the actions to be taken at each step are defined and the utility of these actions are evaluated. Starting at a state and performing actions to reach a terminal state, a policy is determined that maximizes the sum of reinforcements received for the actions.

FIG. 2 illustrates a process flow for generating an execution sequence using reinforcement learning 200, in accordance with an embodiment of the invention. As shown in block 202, the process flow includes electronically receiving one or more requirement modules from one or more computing devices associated with one or more resource development teams. In some embodiments, the one or more requirement modules may be requirements that include a condition of capability that must be met or possessed by a product (e.g., software application) or a component of the product to satisfy a contract, standard, specification, or other formally imposed document within the agile software development framework. In some other embodiments, the one or more requirement modules may be stories that include an informal, natural language description of one or more features of the product to capture a description of the product feature from an end-user perspective. In other words, a story may be a simplified description of a requirement.

In some embodiments, the one or more resource development teams may be a group of people with different functional expertise working toward a common goal. In one aspect, one or more resource development teams may include employees from all levels of an entity. In another aspect, the one or more resource development teams may also include members from outside an entity, such as, third-party developers, suppliers, beta testers, consultants, and/or the like. In some embodiments, the one or more resource development teams often function as self-directed teams assigned to a specific task which calls for the input and expertise of numerous departments.

Next, as shown in block 204, the process flow includes storing the one or more requirement modules in a resource development pipeline, wherein the one or more requirement modules are in a first order of execution. In determining the first order of execution, the system may be configured to determine one or more features associated with the one or more requirement modules received from the one or more resource development teams. In some embodiments, the one or more features may include an estimation of the size of each of the one or more requirement modules. In one aspect, the size of a requirement module may include an amount of time required for the requirement modules to be developed to be executable by the resource development team. In some other embodiments, the one or more features may include determining an amount of work a resource development team can tackle during a single sprint, i.e., velocity. In still other embodiments, the one or more features may include identifying an exposure in the execution of each requirement module.

In some embodiments, the system may be configured to initialize the first order of execution for the one or more requirement modules automatically based on at least the one or more features. In some other embodiments, the system may be configured to electronically receive, from a computing device associated with a user, the first order of execution for the one or more requirement modules. In this regard, the user, as an employee of the entity supervising the execution of the requirement modules, may review the one or more features and make a determination as to the first order of execution.

Next, as shown in block 206, the process flow includes initiating a reinforcement learning algorithm on the one or more requirement modules. In some embodiments, the reinforcement learning algorithm is a specific learning approach in machine learning field that aims to solve problems involving sequential decision making. Typically, reinforcement learning, there is no supervision and instead an agent learns by maximizing rewards. In abstract terms, the agent makes an observation of its environment and estimates a state for which it models and predicts the action to be taken. Once the action is executed, the agent receives a reward (or cost), which will be taken into consideration during future prediction phases. This process may be formalized as a Markov Decision Process (MDP). Examples of reinforcement learning algorithms may include, but is not limited to, Q-learning, State-Action-Reward-State-Action (SARSA), Deep Q Network (DQN), Deep Deterministic Policy Gradient (DDPG), and/or the like.

In the context of the present invention, the agent may be an autonomous engine which acts, directing its activity towards ordering the requirement modules for execution, a set of actions may be an order of execution of the requirement modules, and the environment may be the agile software development environment. Typically, executing an action in a specific state provides the agent with a cost/reward (a numerical score). The goal of the agent is to maximize its total (future) reward. This is achieved by adding the maximum reward attainable from future states to the reward for achieving its current state, effectively influencing the current action by the potential future reward. This potential reward is a weighted sum of the expected values of the rewards of all future steps starting from the current state. During this process, and as the agent aims to maximize its future reward, the agent consults a policy that dictates which action to take, given a particular state.

In some embodiments, the system may be configured to implement a first distributed impact simulation model using the one or more requirement modules in the first order of execution. In this regard, the system may be configured to electronically retrieve the one or more requirement modules stored in the resource development pipeline. In response, the system may be configured to initiate an execution of the one or more requirement modules in the first order of execution.

In response to implementing the first distributed impact simulation model, the system may be configured to initiate the reinforcement learning algorithm on the first distributed impact simulation model. In response, the system may be configured to determine, using the reinforcement learning algorithm, a performance assessment output associated with an execution of each of the one or more requirement modules in the first order of execution. In some embodiments, each time a distributed impact simulation model is implemented on the environment, the state of the environment changes. For example, when the requirement modules are executed in the first order, the environment changes from a first state to a second state. In response, the system may be configured to receive performance assessment output from each requirement module based on at least implementing the first impact simulation model. The performance assessment output provides an indication of how the environment is responding to the first order of execution. In some embodiments, not every requirement module executed in the first order responds positively to the first order of execution. Some requirement modules respond negatively to the first order of execution. As described herein, this may be due to existing dependencies between the requirement modules, changing priorities associated with the requirements modules, uncertainty in resources and development time, exposure factors related to each requirement module, quality assessment issues associated with the execution of each requirement module, other factors specific to each requirement module, and/or the like.

In some embodiments, the system may be configured to initiate an optimization policy engine on the performance assessment output associated with the one or more requirement modules in the first order of execution. In response, the system may be configured to encode, using the optimization policy engine, the performance assessment output into rewards and costs. In this regard, any positive response to the first order of execution is encoded as a reward and a negative response to the first order of execution is encoded as a cost. In some embodiments, if no performance assessment output is recorded from a requirement module, it may be encoded as a cost. In this way, the system may be configured to assign a cost to a first set of the one or more requirement modules in the first order of execution and assigning a reward to a second set of the one or more requirement modules in the first order of execution. In one example, the execution of first requirement module immediately followed by the fifth requirement module may result in a reward due to reconciled inherent dependencies, while the execution of the second requirement module immediately following the fifth requirement module may result in a cost due to priority issues.

In some embodiments, the system may be configured to generate an optimization policy based on at least the rewards and costs. In this regard, the system may be configured to generate a second order of execution based on at least maximizing an aggregated reward calculated from the second set of the first order of execution. In some embodiments, the system may be configured to generate a second distributed impact simulation model based on at least the second order of execution determined using the optimization policy. In response, the system may be configured to implement the second distributed impact simulation model using the one or more requirement modules in the second order of execution. Following from the previous example, in the second distributed impact simulation, the first requirement module and fifth requirement module may stay in the same order, while the second requirement module may be shifted to a different position, changing the order of execution of the requirement modules.

Next, as shown in block 208, the process flow includes determining, using the reinforcement learning algorithm, a final order of execution for the one or more requirement modules. In some embodiments, the cycle of implementing the reinforcement learning and initiating the optimization policy engine to generate one or more optimization policies may be an iterative process. At each iteration, the reinforcement learning algorithm generates a value function that represents how good the current state is. Here, the value function denotes whether the optimal order for execution of the requirement modules are determined. In one aspect, among all possible value-functions, there exist an optimal value function that has higher value than other functions for all states. The reinforcement learning process is implemented iteratively to allow the value function to converge to the optimal value. Typically, the optimal value function drives the decision to determine the optimal order (final order) for execution of the requirement modules.

Next, as shown in block 210, the process flow includes initiating a reordering of the one or more requirement modules from the first order of execution to a final order of execution. Once the final order is determined, the system may be configured to reorder the requirement modules accordingly. In some embodiments, reordering the requirement modules may include reordering the requirement modules from an order of execution in the penultimate iteration to the final order of execution in the ultimate iteration where the value function converges to the optimal value.

Next, as shown in block 212, the process flow includes initiating an execution of the one or more requirement modules in the final order of execution.

As will be appreciated by one of ordinary skill in the art in view of this disclosure, the present invention may include and/or be embodied as an apparatus (including, for example, a system, machine, device, computer program product, and/or the like), as a method (including, for example, a business method, computer-implemented process, and/or the like), or as any combination of the foregoing. Accordingly, embodiments of the present invention may take the form of an entirely business method embodiment, an entirely software embodiment (including firmware, resident software, micro-code, stored procedures in a database, or the like), an entirely hardware embodiment, or an embodiment combining business method, software, and hardware aspects that may generally be referred to herein as a "system." Furthermore, embodiments of the present invention may take the form of a computer program product that includes a computer-readable storage medium having one or more computer-executable program code portions stored therein. As used herein, a processor, which may include one or more processors, may be "configured to" perform a certain function in a variety of ways, including, for example, by having one or more general-purpose circuits perform the function by executing one or more computer-executable program code portions embodied in a computer-readable medium, and/or by having one or more application-specific circuits perform the function.

It will be understood that any suitable computer-readable medium may be utilized. The computer-readable medium may include, but is not limited to, a non-transitory computer-readable medium, such as a tangible electronic, magnetic, optical, electromagnetic, infrared, and/or semiconductor system, device, and/or other apparatus. For example, in some embodiments, the non-transitory computer-readable medium includes a tangible medium such as a portable computer diskette, a hard disk, a random access memory (RAM), a read-only memory (ROM), an erasable programmable read-only memory (EPROM or Flash memory), a compact disc read-only memory (CD-ROM), and/or some other tangible optical and/or magnetic storage device. In other embodiments of the present invention, however, the computer-readable medium may be transitory, such as, for example, a propagation signal including computer-executable program code portions embodied therein.

One or more computer-executable program code portions for carrying out operations of the present invention may include object-oriented, scripted, and/or unscripted programming languages, such as, for example, Java, Perl, Smalltalk, C++, SAS, SQL, Python, Objective C, JavaScript, and/or the like. In some embodiments, the one or more computer-executable program code portions for carrying out operations of embodiments of the present invention are written in conventional procedural programming languages, such as the "C" programming languages and/or similar programming languages. The computer program code may alternatively or additionally be written in one or more multi-paradigm programming languages, such as, for example, F #.

Some embodiments of the present invention are described herein with reference to flowchart illustrations and/or block diagrams of apparatus and/or methods. It will be understood that each block included in the flowchart illustrations and/or block diagrams, and/or combinations of blocks included in the flowchart illustrations and/or block diagrams, may be implemented by one or more computer-executable program code portions. These one or more computer-executable program code portions may be provided to a processor of a general purpose computer, special purpose computer, and/or some other programmable data processing apparatus in order to produce a particular machine, such that the one or more computer-executable program code portions, which execute via the processor of the computer and/or other programmable data processing apparatus, create mechanisms for implementing the steps and/or functions represented by the flowchart(s) and/or block diagram block(s).

The one or more computer-executable program code portions may be stored in a transitory and/or non-transitory computer-readable medium (e.g. a memory) that can direct, instruct, and/or cause a computer and/or other programmable data processing apparatus to function in a particular manner, such that the computer-executable program code portions stored in the computer-readable medium produce an article of manufacture including instruction mechanisms which implement the steps and/or functions specified in the flowchart(s) and/or block diagram block(s).

The one or more computer-executable program code portions may also be loaded onto a computer and/or other programmable data processing apparatus to cause a series of operational steps to be performed on the computer and/or other programmable apparatus. In some embodiments, this produces a computer-implemented process such that the one or more computer-executable program code portions which execute on the computer and/or other programmable apparatus provide operational steps to implement the steps specified in the flowchart(s) and/or the functions specified in the block diagram block(s). Alternatively, computer-implemented steps may be combined with, and/or replaced with, operator- and/or human-implemented steps in order to carry out an embodiment of the present invention.

Although many embodiments of the present invention have just been described above, the present invention may be embodied in many different forms and should not be construed as limited to the embodiments set forth herein; rather, these embodiments are provided so that this disclosure will satisfy applicable legal requirements. Also, it will be understood that, where possible, any of the advantages, features, functions, devices, and/or operational aspects of any of the embodiments of the present invention described and/or contemplated herein may be included in any of the other embodiments of the present invention described and/or contemplated herein, and/or vice versa. In addition, where possible, any terms expressed in the singular form herein are meant to also include the plural form and/or vice versa, unless explicitly stated otherwise. Accordingly, the terms "a" and/or "an" shall mean "one or more," even though the phrase "one or more" is also used herein. Like numbers refer to like elements throughout.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other changes, combinations, omissions, modifications and substitutions, in addition to those set forth in the above paragraphs, are possible. Those skilled in the art will appreciate that various adaptations, modifications, and combinations of the just described embodiments can be configured without departing from the scope and spirit of the invention. Therefore, it is to be understood that, within the scope of the appended claims, the invention may be practiced other than as specifically described herein.

What is claimed is:

1. A system for generating an execution sequence using reinforcement learning, the system comprising:
   at least one non-transitory storage device; and
   at least one processing device coupled to the at least one non-transitory storage device, wherein the at least one processing device is configured to:
   electronically receive one or more requirement modules from one or more computing devices associated with one or more resource development teams;
   store the one or more requirement modules in a resource development pipeline, wherein the one or more requirement modules are in a first order of execution based on one or more features associated with the one or more requirement modules;
   initiate a reinforcement learning algorithm on the one or more requirement modules to iteratively refine an execution order of the one or more requirement modules based on at least an optimal value function driving a decision for a final order of execution for the one or more requirement modules;
   determine, using a reinforcement learning algorithm, the final order of execution for the one or more requirement modules, wherein determining further comprises:
      determining, using the reinforcement learning algorithm, a performance assessment output associated with an execution of each of the said one or more requirement modules in the first order of execution using a first distributed impact simulation model;
      initiating an optimization policy engine on the performance assessment output associated with the one or more requirement modules in the first order of execution;
      encoding the performance assessment output into rewards and costs, wherein a positive response to the first order of execution is encoded as a reward and a negative response to the first order of execution is encoded as a cost;
      generating a subsequent order of execution based on the determined rewards and costs; and
      determining the final order of execution by iteratively refining the execution order of the one or more requirement modules until a convergence of the optimal value function determined by the reinforcement learning algorithm, thus ensuring efficient allocation and utilization of development resources;
   initiate a reordering of the one or more requirement modules from the first order of execution to the final order of execution; and
   initiate an execution of the one or more requirement modules in the final order of execution.

2. The system of claim 1, wherein the at least one processing device is further configured to implement the first distributed impact simulation model, wherein implementing further comprises:
   electronically retrieving the one or more requirement modules stored in the resource development pipeline; and
   initiating an execution of the one or more requirement modules in the first order of execution.

3. The system of claim 1, wherein the at least one processing device is further configured to:
   generate an optimization policy based on at least the rewards and costs, wherein generating further comprises generating a second order of execution based on at least maximizing an aggregated reward calculated from the second set of the first order of execution.

4. The system of claim 3, wherein the at least one processing device is further configured to:

generate a second distributed impact simulation model based on at least the second order of execution determined using the optimization policy; and implement the second distributed impact simulation model using the one or more requirement modules in the second order of execution.

5. The system of claim 4, wherein the at least one processing device is further configured to:

iteratively initiate the optimization policy engine to generate one or more optimization policies and one or more distributed impact simulation models based on one or more execution orders by maximizing aggregated rewards calculated from each of the one or more execution orders; and generate the final order of execution based on iteratively initiating the optimization policy engine to generate one or more optimization policies and one or more distributed impact simulation models based on one or more execution orders by maximizing aggregated rewards calculated from each of the one or more execution orders.

6. The system of claim 1, wherein the at least one processing device is further configured to:

electronically receive, from a computing device associated with a user, the first order of execution for the one or more requirement modules.

7. A computer program product for generating an execution sequence using learning reinforcement, the computer program product comprising a non-transitory computer-readable medium comprising code causing a first apparatus to:

electronically receive one or more requirement modules from one or more computing devices associated with one or more resource development teams;

store the one or more requirement modules in a resource development pipeline, wherein the one or more requirement modules are in a first order of execution based on one or more features associated with the one or more requirement modules;

initiate a reinforcement learning algorithm on the one or more requirement modules to iteratively refine an execution order of the one or more requirement modules based on at least an optimal value function driving a decision for a final order of execution for the one or more requirement modules;

determine, using a reinforcement learning algorithm, the final order of execution for the one or more requirement modules, wherein determining further comprises:

determining, using the reinforcement learning algorithm, a performance assessment output associated with an execution of each of the said one or more requirement modules in the first order of execution using a first distributed impact simulation model;

initiating an optimization policy engine on the performance assessment output associated with the one or more requirement modules in the first order of execution;

encoding the performance assessment output into rewards and costs, wherein a positive response to the first order of execution is encoded as a reward and a negative response to the first order of execution is encoded as a cost;

generating a subsequent order of execution based on the determined rewards and costs; and determining the final order of execution by iteratively refining the execution order of the one or more requirement modules until a convergence of the optimal value function determined by the reinforcement learning algorithm, thus ensuring efficient allocation and utilization of development resources;

initiate a reordering of the one or more requirement modules from the first order of execution to the final order of execution; and initiate an execution of the one or more requirement modules in the final order of execution.

8. The computer program product of claim 7, wherein the first apparatus is further configured to implement the first distributed impact simulation model, wherein implementing further comprises:

electronically retrieving the one or more requirement modules stored in the resource development pipeline; and initiating an execution of the one or more requirement modules in the first order of execution.

9. The computer program product of claim 7, wherein the code further causes the first apparatus to:

generate an optimization policy based on at least the rewards and costs, wherein generating further comprises generating a second order of execution based on at least maximizing an aggregated reward calculated from the second set of the first order of execution.

10. The computer program product of claim 9, wherein the code further causes the first apparatus to:

generate a second distributed impact simulation model based on at least the second order of execution determined using the optimization policy; and implement the second distributed impact simulation model using the one or more requirement modules in the second order of execution.

11. The computer program product of claim 10, wherein the code further causes the first apparatus to:

iteratively initiate the optimization policy engine to generate one or more optimization policies and one or more distributed impact simulation models based on one or more execution orders by maximizing aggregated rewards calculated from each of the one or more execution orders; and generate the final order of execution based on iteratively initiating the optimization policy engine to generate one or more optimization policies and one or more distributed impact simulation models based on one or more execution orders by maximizing aggregated rewards calculated from each of the one or more execution orders.

12. The computer program product of claim 7, wherein the code further causes the first apparatus to:

electronically receive, from a computing device associated with a user, the first order of execution for the one or more requirement modules.

13. A method for generating an execution sequence using learning reinforcement, the method comprising:

electronically receiving one or more requirement modules from one or more computing devices associated with one or more resource development teams;

storing the one or more requirement modules in a resource development pipeline, wherein the one or more requirement modules are in a first order of execution based on one or more features associated with the one or more requirement modules;

initiating a reinforcement learning algorithm on the one or more requirement modules to iteratively refine an execution order of the one or more requirement modules based on at least an optimal value function driving a decision for a final order of execution for the one or more requirement modules;

determining, using a reinforcement learning algorithm, the final order of execution for the one or more requirement modules, wherein determining further comprises:
determining, using the reinforcement learning algorithm, a performance assessment output associated with an execution of each of the said one or more requirement modules in the first order of execution using a first distributed impact simulation model;
initiating an optimization policy engine on the performance assessment output associated with the one or more requirement modules in the first order of execution;
encoding the performance assessment output into rewards and costs, wherein a positive response to the first order of execution is encoded as a reward and a negative response to the first order of execution is encoded as a cost;
generating a subsequent order of execution based on the determined rewards and costs; and
determining the final order of execution by iteratively refining the execution order of the one or more requirement modules until a convergence of the optimal value function determined by the reinforcement learning algorithm, thus ensuring efficient allocation and utilization of development resources;
initiating a reordering of the one or more requirement modules from the first order of execution to the final order of execution; and
initiating an execution of the one or more requirement modules in the final order of execution.

14. The method of claim 13, wherein implementing further comprises:
electronically retrieving the one or more requirement modules stored in the resource development pipeline; and
initiating an execution of the one or more requirement modules in the first order of execution.

\* \* \* \* \*